(12) United States Patent
Tsubata et al.

(10) Patent No.: US 10,006,826 B2
(45) Date of Patent: Jun. 26, 2018

(54) SEMICONDUCTOR PRESSURE SENSOR DEVICE

(71) Applicant: Hokuriku Electric Industry Co., Ltd., Toyama-shi, Toyama (JP)

(72) Inventors: Satoshi Tsubata, Toyama (JP); Hiroyuki Sawamura, Toyama (JP)

(73) Assignee: Hokuriku Electric Industry Co., Ltd., Toyama-shi (JP)

( * ) Notice: Subject to any disclaimer, the term of this patent is extended or adjusted under 35 U.S.C. 154(b) by 0 days. days.

(21) Appl. No.: 15/531,488

(22) PCT Filed: Dec. 1, 2015

(86) PCT No.: PCT/JP2015/083770
§ 371 (c)(1),
(2) Date: May 30, 2017

(87) PCT Pub. No.: WO2016/088756
PCT Pub. Date: Jun. 9, 2016

(65) Prior Publication Data
US 2017/0328802 A1     Nov. 16, 2017

(30) Foreign Application Priority Data

Dec. 1, 2014 (JP) ................................. 2014-243174

(51) Int. Cl.
*H01L 29/84* (2006.01)
*G01L 19/14* (2006.01)
(Continued)

(52) U.S. Cl.
CPC ............ *G01L 19/14* (2013.01); *B81B 7/0041* (2013.01); *G01L 9/0042* (2013.01); *G01L 9/0051* (2013.01); *B81B 2201/0264* (2013.01)

(58) Field of Classification Search
CPC .......... B81B 2201/0257; B81B 3/0021; B81B 2203/0127; B81B 2203/0315; H04R 19/04
(Continued)

(56) References Cited

U.S. PATENT DOCUMENTS 5,900,554 A * 5/1999 Baba ................... G01L 19/0038
                                                           73/725
6,131,467 A * 10/2000 Miyano ............... G01L 19/0084
                                                           73/756

(Continued)

FOREIGN PATENT DOCUMENTS

JP       4281178       3/2009
JP     2014-209109    11/2014

OTHER PUBLICATIONS

International Search Report, dated Dec. 28, 2015 (Dec. 28, 2015), 1 page.

*Primary Examiner* — Andy Huynh
(74) *Attorney, Agent, or Firm* — Rankin, Hill & Clark LLP (57) ABSTRACT

A semiconductor pressure sensor device in which the shape or the structure of a connector portion can be easily changed and which has high waterproof performance. A terminal housing and a second case are engaged with each other via an engagement structure. The terminal housing and a first case are fitted with each other via a fitting structure. Thus, the first case and the second case are fixed to each other via the terminal housing. The first case is fitted in the second case. Then, the terminal housing is fitted with the first case, and the terminal housing is engaged with the second case substantially at the same time. Through such simple process, an opening portion of the first case is covered and a connector portion configured to enable external terminals to
(Continued)

be connected to ends, located on one side, of a plurality of lead terminals is formed.

18 Claims, 6 Drawing Sheets (51) Int. Cl.
*G01L 9/00* (2006.01)
*B81B 7/00* (2006.01)

(58) Field of Classification Search
USPC ........................................................ 257/419
See application file for complete search history.

(56) References Cited

U.S. PATENT DOCUMENTS

| | | | |
|---|---|---|---|
| 6,439,058 B1 | 8/2002 | Aratani et al. | |
| 7,143,651 B2 * | 12/2006 | Sasaki | G01D 11/245 73/721 |
| 7,603,908 B2 * | 10/2009 | Asada | G01L 19/0084 73/700 |
| 8,154,007 B2 | 4/2012 | Speldrich et al. | |

* cited by examiner

SEMICONDUCTOR PRESSURE SENSOR DEVICE

TECHNICAL FIELD

The present invention relates to a semiconductor pressure sensor device that can be manufactured through a smaller number of simpler processes.

BACKGROUND ART

Figure 10:
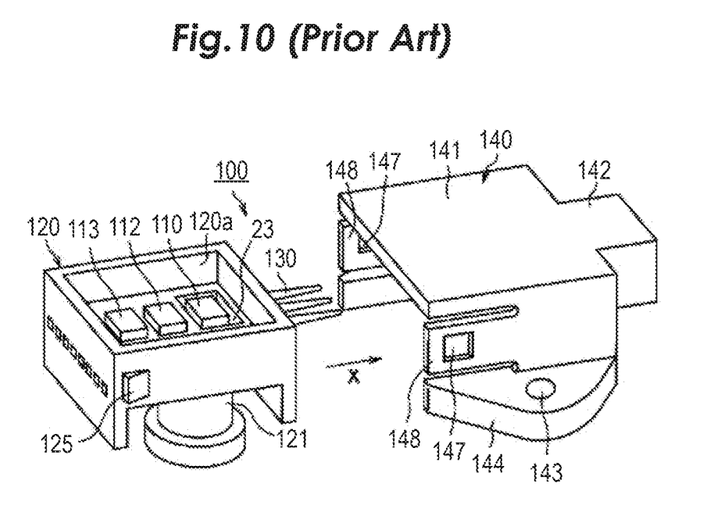
FIG. 10 illustrates the configuration of a semiconductor pressure sensor device according to the related art.

FIG. 10 illustrates a semiconductor pressure sensor device according to the related art illustrated in FIG. 1 of JP 4281178 B (Patent Document 1) with the reference numerals increased by 100 from those allocated to the counterparts of the Patent Document 1. The semiconductor pressure sensor device according to the related art includes a first case 120, leads 130, a second case 140, and a surrounding portion 142. The first case 120 is molded from a resin. A sensor element constituted of a semiconductor is disposed in the first case 120. The leads 130 are insert-molded in the first case 120 such that portions of the leads 130 are exposed from the first case 120, and electrically connected to the sensor element. The second case 140 is assembled with the first case 120 to cover the sensor element. The surrounding portion 142 is formed on the second case 140 to surround the exposed portions of the leads 130. The exposed portions of the leads 130 and the surrounding portion 142 constitute a connector portion that enables the exposed portions of the leads 130 to be connected to external terminals. The first case 120 and the second case 140 slide to fit with each other. An engagement structure (125, 147) is provided between the first case 120 and the second case 140 for retention. The first case 120 is integrally provided with a cylindrical body 121 into which a fluid to be measured flows.

RELATED-ART DOCUMENT

Patent Document

Patent Document 1: JP 4281178 B

SUMMARY OF INVENTION

Technical Problems

In the semiconductor pressure sensor device according to Patent Document 1, the second case 140 integrally includes the surrounding portion 142 which surrounds the exposed portions of the leads. Therefore, if it is attempted to change the shape or the structure of the connector portion, it is necessary to redesign the second case 140. The surrounding portion 142 is integrally provided with a portion to be engaged with a mating connector. Since the surrounding portion 142 is integrally provided, the direction of attachment of the mating connector may be limited to one direction.

In the structure described in Patent Document 1, an entrance to a clearance formed between the outer wall surface of the first case 120 and the inner wall surface of the second case 140 is exposed on a side surface on the side opposite to the side on which the surrounding portion 142 is formed when the first case 120 and the second case 140 are fitted with each other. Moreover, the second case 140 does not have a wall portion on the side where the cylindrical body 121, which is provided at first case 120, projects. Therefore, an entrance to a clearance formed between the outer wall surface of the first case 120 and the inner wall surface of the second case 140 is also exposed on the side where the cylindrical body 121 projects. In a situation with such clearances, water will likely enter into the inside through the clearances.

It is an object of the present invention to provide a semiconductor pressure sensor device in which the shape or the structure of a connector portion can be easily changed.

It is another object of the present invention to provide a semiconductor pressure sensor device with better waterproof performance than the related art.

Solution to Problems

A semiconductor pressure sensor device according to the present invention includes a first case, lead terminals, a second case, and a terminal housing. The first case includes an opening portion provided in one surface, a bottom wall portion opposing the opening portion, a peripheral wall portion integrally provided with the bottom wall portion, and a cylindrical body projecting in a direction away from the opening portion to form a pressure introduction port. The first case is made of an insulating resin, and houses a pressure sensor element made of a semiconductor such that a pressure introduced through the pressure introduction port acts on the pressure sensor element. The lead terminals each have a first end and a second end. The first ends of the lead terminals are electrically connected to the pressure sensor element, and the second ends of the lead terminals project in one direction from the peripheral wall portion of the first case.

The second case is made of a resin, and is configured to cover the opening portion of the first case. The second case includes an opening portion through which the plurality of lead terminals extend when the second case slides to fit with the first case from a direction opposite to the one direction, and a groove portion with which the cylindrical body slides to fit.

The terminal housing is made of a resin, and attached to the first case via an engagement structure to surround the second ends of the plurality of lead terminals and to form a connector portion configured to enable external terminals to be connected to the second ends of the plurality of lead terminals.

In the semiconductor pressure sensor according to the present invention, the terminal housing and the second case are engaged with each other via an engagement structure, and the terminal housing and the first case are fitted with each other via a fitting structure.

Hence, in the semiconductor pressure sensor according to the present invention, during the assembly process of the semiconductor pressure sensor, the terminal housing and the first case are fitted with each other, and the terminal housing and the second case are engaged with each other. Thus, the first case and the second case are fixed to each other owing to the presence of the terminal housing.

According to the present invention, the terminal housing and the first case are separately formed. Thus, the structure of the connector can be changed by changing one of the terminal housing and the first case in most cases. Thus, the shape or the structure of the connector portion can be changed easily. In addition, the groove portion of the second case with which the cylindrical body slides to fit and the wall surface of the first case completely oppose each other even if the semiconductor pressure sensor is installed with the cylindrical body directed upward, thereby preventing water from directly entering the first case through the groove portion. Thus, the waterproof performance can be improved compared to the related art. Further, the opening end portion of the first case with which the second case is fitted is covered by the terminal housing. Thus, the clearance which is formed at the fitting portion between the first case and the second case is blocked by the terminal housing, thereby enhancing the waterproof property.

In the semiconductor pressure sensor device according to the present invention, the engagement structure that engages the terminal housing and the second case may include first to n-th engaged portions provided on one of the terminal housing and the second case, n being a positive integer of 2 or more, and first to n-th engaging portions provided on the other of the terminal housing and the second case to be respectively engaged with the first to n-th engaged portions. If the engagement structure includes the plurality of engaged portions and the plurality of engaging portions, engaging operation can be smoothly performed. This is because even if dimensional accuracy of the components varies to some extent, such variations can be absorbed.

Specifically, the first to n-th engaged portions include a first engaged portion to a third engaged portion. The first and second engaged portions are respectively provided on first and second sidewall portions of the second case that interpose the opening portion of the second case and in which the groove portion is not formed, and the third engaged portion is provided on a fourth sidewall portion opposing a third sidewall portion in which the groove portion is formed. The terminal housing includes first to fourth opposing sidewall portions fitted in the opening portion of the second case and respectively opposing the first to fourth sidewall portions. The first to n-th engaging portions include first to third engaging portions. The first and second engaging portions are provided on the first and second opposing sidewall portions of the terminal housing and the third engaging portion is provided on the fourth opposing sidewall portion.

Further, in the semiconductor pressure sensor device according to the present invention, the first and second sidewall portions may each have a flexible structure; the first and second engaged portions may each be formed of a recess or a hole; the third engaged portion may be formed of a recess, a hole, or a stepped portion; the first and second engaging portions may each be formed of a protrusion to be fitted in the recesses or the holes; and the third engaging portion may be formed of a protrusion to be fitted in the recess or the hole or a protrusion that climbs over the stepped portion to be engaged with the stepped portion.

Furthermore, the fitting structure which fits the terminal housing and the first case with each other may include first to m-th fitted portions provided on one of the terminal housing and the first case, m being a positive integer of 2 or more, and first to m-th fitting portions provided on the other of the terminal housing and the first case to be respectively fitted with the first to m-th fitted portions. When the fitting structure includes the plurality of fitted portions and the plurality of fitting portions, even if dimensional accuracy of the components varies to some extent, fitting operation can be smoothly performed since such variations are absorbed.

Specifically, the first to m-th fitted portions may be provided on a sidewall portion of the peripheral wall portion of the first case from which the plurality of lead terminals extend; and the first to m-th fitting portions may be provided at the terminal housing to be respectively fitted with the first to m-th fitted portions.

The opening portion of the first case may be blocked by a sheet that is air permeable but not water permeable. Providing such a sheet can further enhance the waterproof property.

DESCRIPTION OF EMBODIMENTS

A semiconductor pressure sensor device according to an embodiment of the present invention will be described below with reference to the drawings. FIGS. 1 to 8 illustrate a semiconductor pressure sensor device according to an embodiment of the present invention. The semiconductor pressure sensor device according to the illustrated embodiment includes a first case 1, lead terminals 3, a second case 5, and a terminal housing 7.

The first case 1 has a generally rectangular parallelepiped shape, and includes an opening portion 13 formed in the upper surface, a bottom wall portion 15 opposing the opening portion 13, and a peripheral wall portion 17 with four surfaces integrally provided with the bottom wall portion 15. The first case 1 further includes a cylindrical body 21 projecting in a direction away from the bottom wall portion 15 to form a pressure introduction port 19.

Figure 8A:
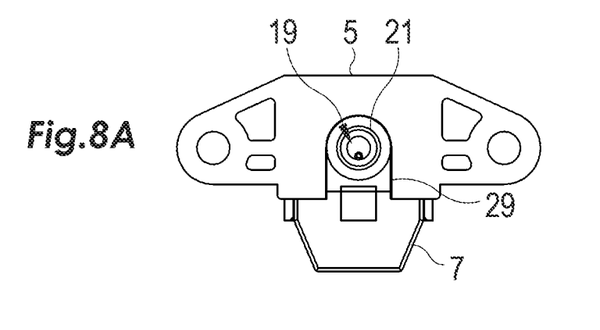
FIGS. 8A and 8B are a back view and a sectional view taken along line A-A of FIG. 6C, respectively, of the semiconductor pressure sensor device of FIG. 6.
Figure 8B:
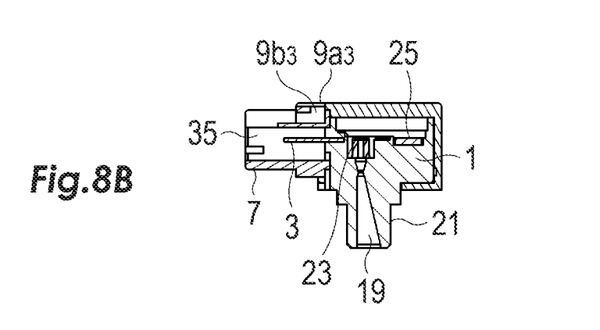

As well illustrated in FIG. 8B, a pressure sensor element constituted of a semiconductor is mounted on a circuit substrate 25, and housed in the first case 1. The pressure sensor element 23 is housed in the first case 1 which is made of an insulating resin such that an external pressure introduced through the pressure introduction port 19 acts on the pressure sensor element 23. That is, when the external pressure acts on a diaphragm of the pressure sensor element 23 through the pressure introduction port 19, the diaphragm is deformed to vary the resistance value of a resistance element, and variations in resistance value are detected by a resistance bridge circuit to detect the pressure.

A fluid passed through the pressure introduction port 19, for example, water is subjected to pressure detection. Fluctuations in level of water in a tank can be monitored by disposing underwater the pressure introduction port 19 of the semiconductor pressure sensor device according to the embodiment and detecting the magnitude of the pressure.

An electrical signal that represents the pressure is output by the lead terminals 3. First ends of the lead terminals 3 are electrically connected to the pressure sensor element 23. Second ends of the lead terminal 3 project in one direction from one surface of the peripheral wall portions 17 of the first case 1.

The second case 5, which is made of an insulating resin, includes an opening portion 27 and a groove portion 29. Three lead terminals 3 extend through the opening portion 27 when the second case 5 slides to fit with the first case 1 from the direction opposite to one direction (the direction of projection of the lead terminals 3). The cylindrical body 21 of the first case 1 slides to fit with the groove portion 29. The second case 5 covers the opening portion 13 of the first case 1. That is, the inner surface of the second case 5 is formed to be complementary to the outer shape of the first case 1 except for the cylindrical body 21. With the second case 5 configured in this way, the groove portion 29 with which the cylindrical body 21 slides to fit and the wall surface of the first case 1 completely oppose each other even if the semiconductor pressure sensor is installed with the cylindrical body 21 directed upward, thereby preventing water from directly entering the first case through the groove portion 29. Flanges 33, 33 project from side surfaces of the second case opposing each other. The flanges 33 and 33 allow the semiconductor pressure sensor device to be attached onto a flat surface using bolts or screws.

The terminal housing 7, which is made of a resin, is attached to the first case 1 to surround the second ends of the three lead terminals 3, and to form a connector portion 35 configured to enable external terminals to be connected to the second ends of the three lead terminals 3. To this end, the terminal housing 7 is formed to constitute a connector shape according to a predetermined standard together with the second ends of the lead terminals 3.

In the semiconductor pressure sensor device according to the embodiment, the terminal housing 7 and the second case 5 are engaged with each other via an engagement structure ($9a_1$ to $9a_3$ and $9b_1$ to $9b_3$), and the terminal housing 7 and the first case 1 are fitted with each other via a fitting structure ($11a_1$, $11a_2$, $11b_1$, $11b_2$, $18a_1$, $18a_2$, $18b_1$, and $18b_2$). As a result, most of the clearance formed between the first case 1 and the second case 5 which are fitted with each other is covered by the terminal housing 7, thereby preventing entry of water through the clearance.

As well illustrated in FIGS. 1 to 5, a plurality of engaged portions of the second case 5 of the semiconductor pressure sensor device according to the embodiment include a first engaged portion $9a_1$ to a third engaged portion $9a_3$. The first engaged portion $9a_1$ and the second engaged portion $9a_2$ are provided in the first sidewall portion 37 and the second sidewall portion 39 which interpose the opening portion 27 of the second case 5 and in which the groove portion 29 is not formed. The third engaged portion $9a_3$ is provided in the fourth sidewall portion 43 opposing the third sidewall portion 41 in which the groove portion 29 is formed. The terminal housing 7 has a first opposing sidewall portion 45 to a fourth opposing sidewall portion 51 to be fitted in the opening portion 27 of the second case 5 to oppose the first sidewall portion 37 to the fourth sidewall portion 43, respectively. The first engaging portion $9b_1$ to the second engaging portion $9b_2$ are provided on the first opposing sidewall portion 45 and the second opposing sidewall portion 47 of the terminal housing 7. The third engaging portion $9b3$ is provided on the fourth opposing sidewall portion 51.

In the semiconductor pressure sensor device according to the embodiment, at least the first sidewall portion 37 and the second sidewall portion 39 have a flexible structure. In order to appropriately adjust the flexibility of the first sidewall portion 37 and the second sidewall portion 39 in the vicinity of the first engaged portion $9a_1$ and the second engaged portion $9a_2$, the first sidewall portion 37 and the second sidewall portion 39 are each provided with a slit 53 that extends from the opening portion 27 to pass near the first engaged portion $9a_1$ and the second engaged portion $9a_2$. The first engaged portion $9a_1$ and the second engaged portion $9a_2$ are each formed of a hole. The third engaged portion $9a_3$ is formed of a stepped portion. The first engaging portion $9b_1$ and the second engaging portion $9b_2$ are each formed of a protrusion to be fitted in a hole. The third engaging portion $9b_3$ is formed of a protrusion that climbs over a stepped portion to be engaged with the stepped portion.

With such an engagement structure, when the second case 5 and the terminal housing 7 are moved in the direction toward each other while retaining the attitude illustrated in the figures, the engaged portions ($9a_1$ to $9a_3$) and the engaging portions ($9b_1$ to $9b_3$) are engaged to be fixed to each other.

Further, in the semiconductor pressure sensor device according to the embodiment, the sidewall portion 17a, from which the three lead terminals 3 project, of the peripheral wall portion 17 of the first case 1 is provided with the first engaged portion $11a_1$, the second engaged portion $11a_2$, the third fitted portion $18a_1$, and the fourth fitted portion $18a_2$, and the terminal housing 7 is provided with the first fitting portion $11b_1$, the second fitting portion $11b_2$, the third fitting portion $18b_1$, and the fourth fitting portion $18b_2$ to be fitted with the first fitted portion $11a_1$, the second fitted portion $11a_2$, the third fitted portion $18a_1$, and the fourth fitted portion $18a_2$, respectively. The first fitting portion $11b_1$ and the second fitting portion $11b_2$ are each a projecting portion that projects along a direction in which the first case 1 and the terminal housing 7 are brought closer to each other. The third fitting portion $18b_1$ and the fourth fitting portion $18b_2$ each include a wall portion that forms a part of the third opposing sidewall portion 49. The first fitted portion $11a_1$ and the second fitted portion $11a_2$ respectively include recesses shaped to be opened in a direction toward the terminal housing 7 and a direction away from each other and to be fitted with the first fitting portion $11b_1$ and the second fitting portion $11b_2$. The third fitted portion $18a_1$ and the fourth fitted portion $18a_2$ respectively include projecting portions that project toward the terminal housing 7.

With such a fitting structure, when the first case 1 and the terminal housing 7 are moved in a direction toward each other while retaining the attitude illustrated in the figures, the first fitting portion $11b_1$, the second fitting portion $11b_2$, the third fitting portion $18b_1$, and the fourth fitting portion $18b_2$ are fitted with the first fitted portion $11a_1$, the second fitted portion $11a_2$, the third fitted portion $18a_1$, and the fourth fitted portion $18a_2$, respectively, thereby allowing the first case 1 and the terminal housing 7 to be positioned with respect to each other even if dimensional accuracy of the components varies to some extent. The first case 1 and the second case 5 are fixed to each other with the terminal housing 7 interposed therebetween when the engaged portions ($9a_1$ to $9a_3$) and the engaging portions ($9b_1$ to $9b_3$) are engaged with each other.

According to the semiconductor pressure sensor device of the embodiment, by moving the second case 5 which houses the first case 1 in a direction toward the terminal housing 7 in the process of assembling the semiconductor pressure sensor device, the terminal housing 7 and the first case 1 are positioned with respect to each other by the fitting structure, the terminal housing 7 and the second case 5 are fixed to each other by the engagement structure at the same time, and then the first case 1 and the second case 5 are fixed to each other using the terminal housing 7.

Figure 1:
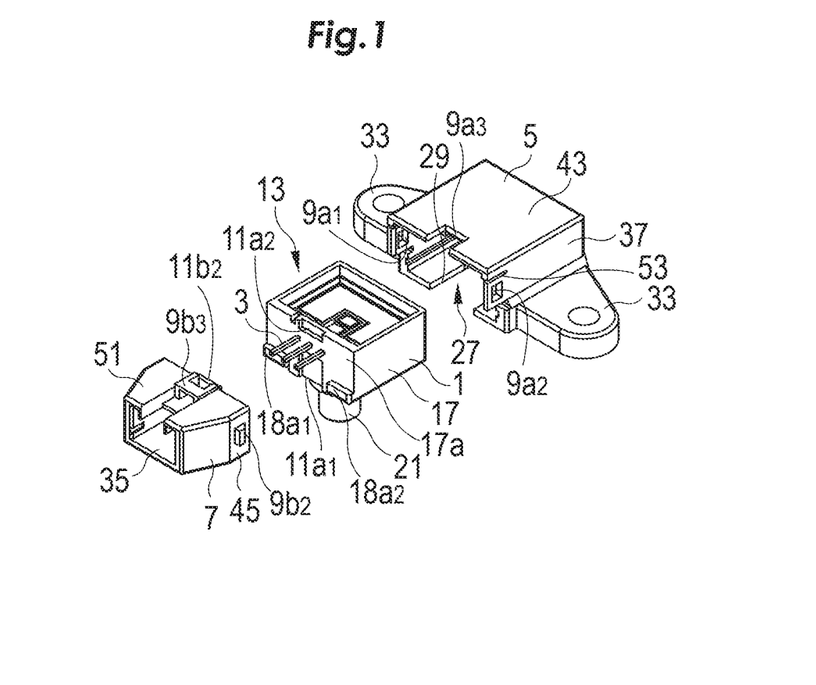
FIG. 1 is a perspective view of a semiconductor pressure sensor device according to the present invention, illustrating that a first case, a second case, and a terminal housing are not assembled yet.
Figure 2:
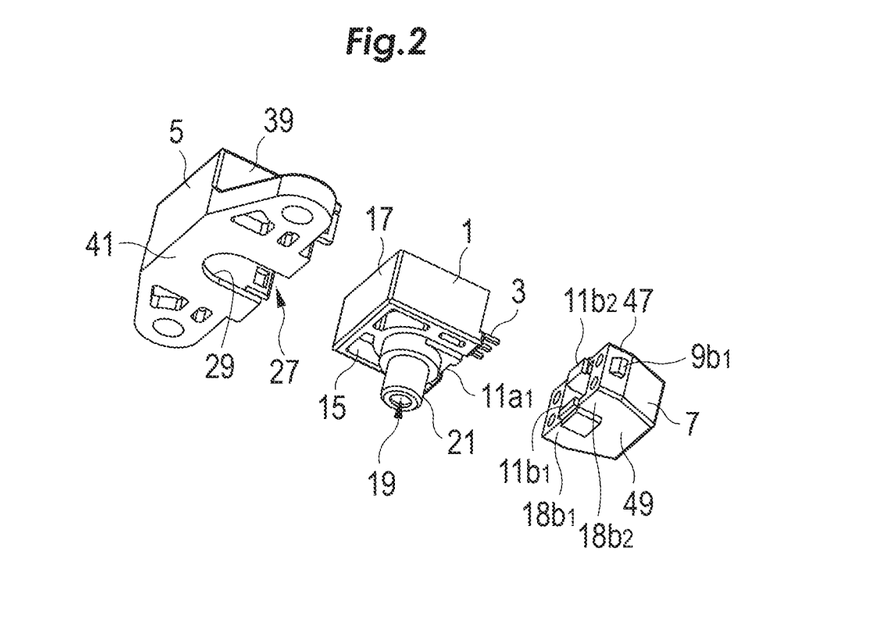
FIG. 2 is a perspective view of the semiconductor pressure sensor device of FIG. 1 before being assembled as viewed from the direction opposite to FIG. 1.
Figure 3A:
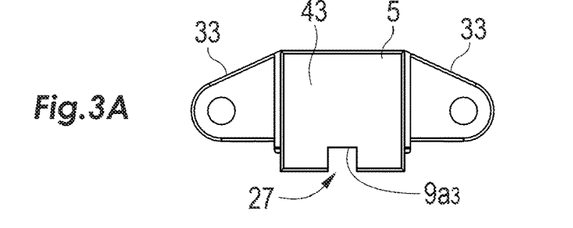
FIG. 3 is a front view illustrating the semiconductor pressure sensor device of FIG. 1 before being assembled.
Figure 3B:
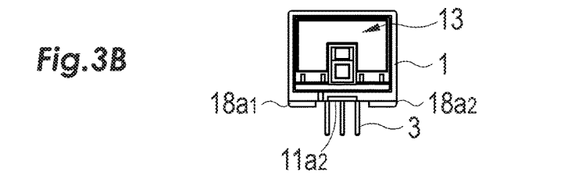
Figure 3C:
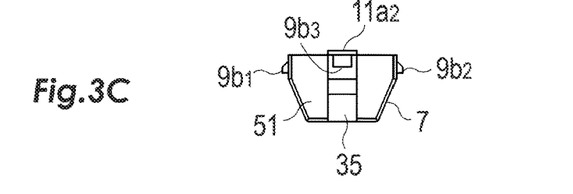
Figure 4A:
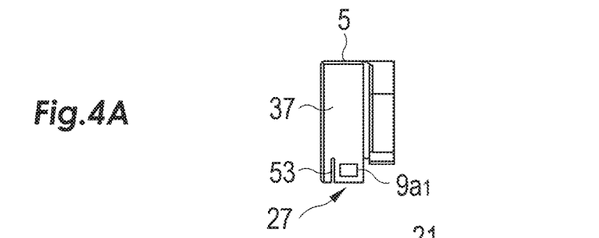
FIG. 4 is a right side view illustrating the semiconductor pressure sensor device of FIG. 1 before being assembled.
Figure 4B:
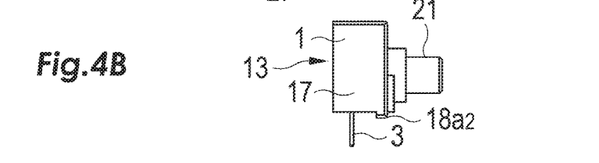
Figure 4C:
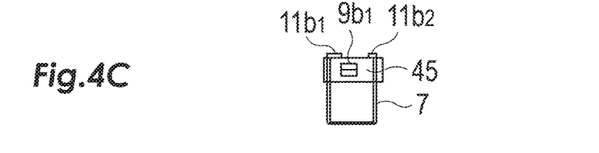
Figure 5A:
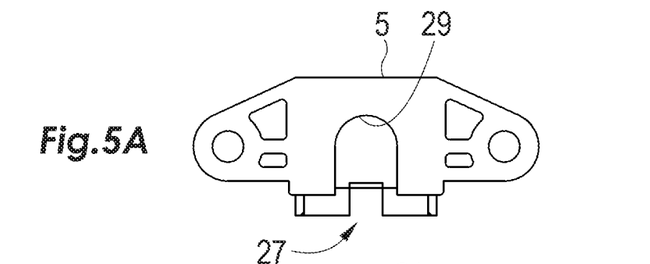
FIG. 5 is a back view illustrating the semiconductor pressure sensor device of FIG. 1 before being assembled.
Figure 5B:
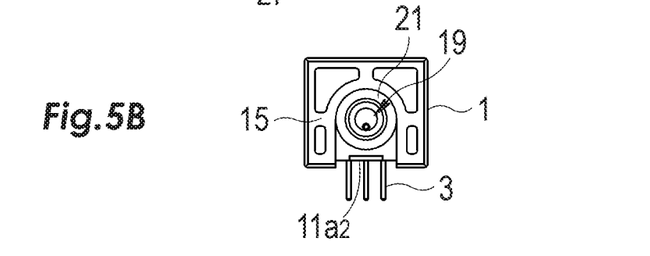
Figure 5C:
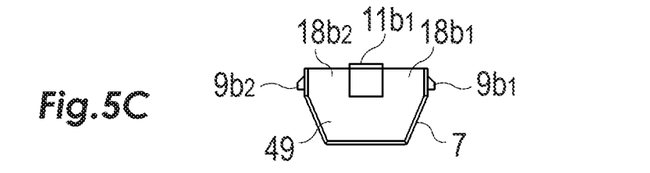
Figure 6A:
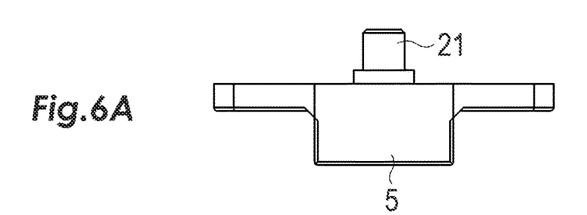
FIGS. 6A, 6B, and 6C are a plan view, a front view, and a bottom view, respectively, illustrating the semiconductor pressure sensor device of FIG. 1 after being assembled.
Figure 6B:
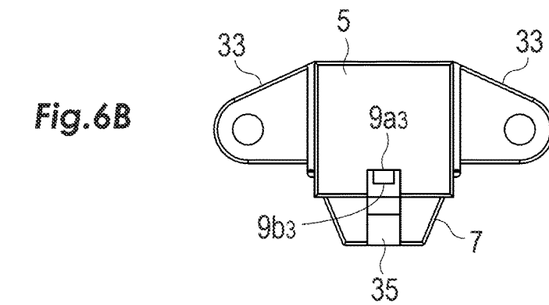
Figure 6C:
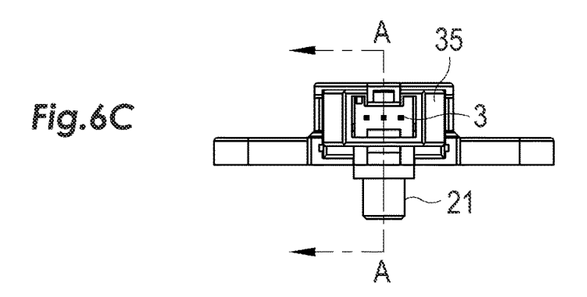
Figure 7:
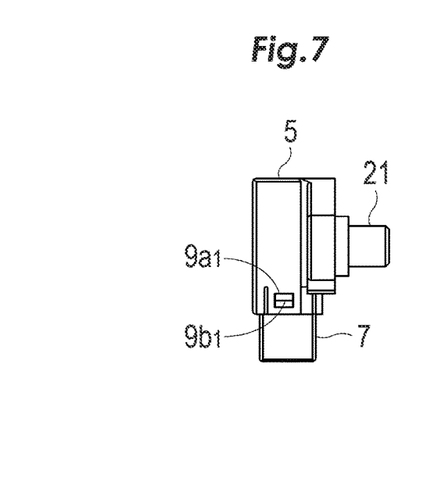
FIG. 7 is a right side view illustrating the semiconductor pressure sensor device of FIG. 6.

Thus, an assembly is completed through a simple process. The opening portion of the first case 1 is covered and the connector portion 35 configured to enable external terminals to be connected to the second ends of the three lead terminals is formed as illustrated in FIGS. 6 to 8. In the assembling process, the housing of the first case 1 is slid to be fitted in the second case 5. Then, the terminal housing 7 is fitted with the first case 1 and at the same time the terminal housing 7 is engaged with the second case 5.

The embodiment described above is an example of preferred embodiments. When generally described, the engagement structure includes first to n-th engaged portions provided on one of the terminal housing 7 and the second case 5, n being a positive integer of 2 or more, and first to n-th engaging portions provided on the other of the terminal housing 7 and the second case 5 to be respectively engaged with the first to n-th engaged portions. The fitting structure includes first to m-th fitted portions provided on one of the terminal housing 7 and the first case 1, m being a positive integer of 2 or more, and first to m-th fitting portions provided on the other of the terminal housing 7 and the first case 1 to be respectively fitted with the first to m-th fitted portions.

In the semiconductor pressure sensor device according to the embodiment, the opening portion can be closed and the connector can be formed merely by sliding the first case 1, the second case 5, and the terminal housing 7 with respect to each other in the final assembling process. More complicated work such as welding and soldering is not required. Hence, it is possible to reduce the number of processes, and to simplify the processes.

Figure 9:
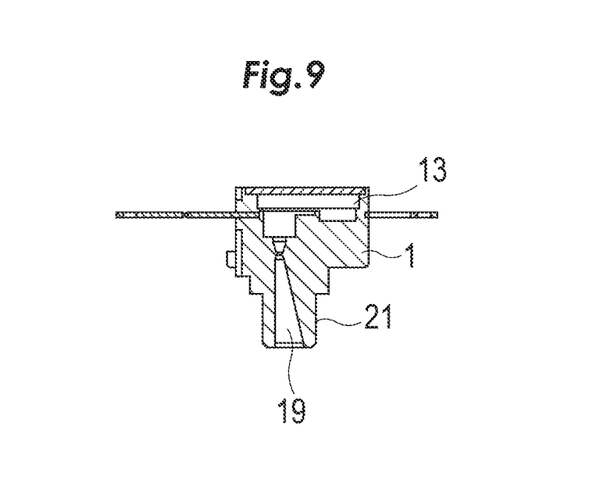
FIG. 9 illustrates an additional waterproof structure.

As illustrated in FIG. 9, the opening portion 13 of the first case 1 may be covered by a sheet 14 that is air permeable but not water permeable. An air-permeable waterproof sheet formed of a porous resin material or the like can be used as such a sheet. Providing such a sheet can further enhance the waterproof property. In FIG. 9, internal components are not illustrated for simplification.

INDUSTRIAL APPLICABILITY

According to the present invention, the terminal housing 7 and the first case 1 are separately formed. Thus, the structure of the connector can be changed by changing one of the terminal housing 7 and the first case 1 in most cases. Thus, the shape or the structure of the connector portion can be changed easily.

DESCRIPTION OF REFERENCE NUMERALS

1 first case
3 lead terminal
5 second case
7 terminal housing
9$a_1$ to 9$a_3$ first engaged portion to third engaged portion
9$b_1$ to 9$b_3$ first engaging portion to third engaging portion
11$a_1$ first fitted portion
11$a_2$ second fitted portion
11$b_1$ first fitting portion
11$b_2$ second fitting portion
18$a_1$ third fitted portion
18$a_2$ fourth fitted portion
18$b_1$ third fitting portion
18$b_2$ fourth fitting portion
13 opening portion
15 bottom wall portion
17 sidewall portion
19 pressure introduction port
21 cylindrical body
23 pressure sensor element
25 circuit substrate
27 opening portion
29 groove portion
33 flange
35 connector portion
37 first sidewall portion
39 second sidewall portion
41 third sidewall portion
43 fourth sidewall portion
45 first opposing sidewall portion
47 second opposing sidewall portion
49 third opposing sidewall portion
51 fourth opposing sidewall portion
53 slit

The invention claimed is:

1. A semiconductor pressure sensor device comprising:
a first case made of an insulating resin and including an opening portion provided in one surface, a bottom wall portion opposing the opening portion, a peripheral wall portion integrally provided with the bottom wall portion, and a cylindrical body projecting in a direction away from the opening portion to form a pressure introduction port, wherein the first case houses a pressure sensor element made of a semiconductor such that a pressure introduced through the pressure introduction port acts on the pressure sensor element;
a plurality of lead terminals each having a first end and a second end, wherein the first ends of the lead terminals are electrically connected to the pressure sensor element and the second ends of the lead terminals project in one direction from the peripheral wall portion of the first case;
a second case made of a resin and configured to cover the opening portion of the first case, the second case including an opening portion through which the plurality of lead terminals extend when the second case slides to fit with the first case from a direction opposite to the one direction, and a groove portion with which the cylindrical body slides to fit; and
a terminal housing made of a resin and attached to the first case via a fitting structure to surround the second ends of the plurality of lead terminals and to form a connector portion configured to enable external terminals to be connected to the second ends of the plurality of lead terminals, wherein:
the terminal housing and the second case are engaged with each other via an engagement structure;
the engagement structure includes first to third engaged portions provided on one of the terminal housing and the second case, and first to third engaging portions provided on the other of the terminal housing and the second case to be respectively engaged with the first to third engaged portions;
the first and second engaged portions are respectively provided on first and second sidewall portions of the second case that interpose the opening portion of the second case and in which the groove portion is not formed, and the third engaged portion is provided on a fourth sidewall portion opposing a third sidewall portion in which the groove portion is formed;

the terminal housing includes first to fourth opposing sidewall portions fitted in the opening portion of the second case and respectively opposing the first to fourth sidewall portions;

the first and second engaging portions are provided on the first and second opposing sidewall portions of the terminal housing, and the third engaging portion is provided on the fourth opposing sidewall portion;

the first and second sidewall portions each have a flexible structure;

the first and second engaged portions are each formed of a recess or a hole;

the third engaged portion is formed of a recess, a hole, or a stepped portion;

the first and second engaging portions are each formed of a protrusion to be fitted in the recesses or the holes that form the first and second engaged portions; and the third engaging portion is formed of a protrusion to be fitted in the recess or the hole that forms the third engaged portion or a protrusion that climbs over the stepped portion to be engaged with the stepped portion.

2. A semiconductor pressure sensor device comprising:

a first case made of an insulating resin and including an opening portion provided in one surface, a bottom wall portion opposing the opening portion, a peripheral wall portion integrally provided with the bottom wall portion, and a cylindrical body projecting in a direction away from the opening portion to form a pressure introduction port, wherein the first case houses a pressure sensor element made of a semiconductor such that a pressure introduced through the pressure introduction port acts on the pressure sensor element;

a plurality of lead terminals each having a first end and a second end, wherein the first ends of the lead terminals are electrically connected to the pressure sensor element and the second ends of the lead terminals project in one direction from the peripheral wall portion of the first case;

a second case made of a resin and configured to cover the opening portion of the first case, the second case including an opening portion through which the plurality of lead terminals extend when the second case slides to fit with the first case from a direction opposite to the one direction, and a groove portion with which the cylindrical body slides to fit; and a terminal housing made of a resin and attached to the first case via a fitting structure to surround the second ends of the plurality of lead terminals and to form a connector portion configured to enable external terminals to be connected to the second ends of the plurality of lead terminals, wherein:

the terminal housing and the second case are engaged with each other via an engagement structure.

3. The semiconductor pressure sensor device according to claim 2, wherein the engagement structure that engages the terminal housing and the second case includes first to n-th engaged portions provided on one of the terminal housing and the second case, n being a positive integer of 2 or more, and first to n-th engaging portions provided on the other of the terminal housing and the second case to be respectively engaged with the first to n-th engaged portions.

4. The semiconductor pressure sensor device according to claim 3, wherein:

the first to n-th engaged portions include a first engaged portion to a third engaged portion;

the first and second engaged portions are respectively provided on first and second sidewall portions of the second case that interpose the opening portion of the second case and in which the groove portion is not formed, and the third engaged portion is provided on a fourth sidewall portion opposing a third sidewall portion in which the groove portion is formed;

the terminal housing includes first to fourth opposing sidewall portions fitted in the opening portion of the second case and respectively opposing the first to fourth sidewall portions;

the first to n-th engaging portions include first to third engaging portions; and the first and second engaging portions are provided on the first and second opposing sidewall portions of the terminal housing, and the third engaging portion is provided on the fourth opposing sidewall portion.

5. The semiconductor pressure sensor device according to claim 4, wherein:

the first and second sidewall portions each have a flexible structure;

the first and second engaged portions are each formed of a recess or a hole;

the third engaged portion is formed of a recess, a hole, or a stepped portion;

the first and second engaging portions are each formed of a protrusion to be fitted in the recesses or the holes that form the first and second engaged portions; and the third engaging portion is formed of a protrusion to be fitted in the recess or the hole that forms the third engaged portion or a protrusion that climbs over the stepped portion to be engaged with the stepped portion.

6. The semiconductor pressure sensor device according to claim 4, wherein the fitting structure which fits the terminal housing and the first case with each other includes first to m-th fitted portions provided on one of the terminal housing and the first case, m being a positive integer of 2 or more, and first to m-th fitting portions provided on the other of the terminal housing and the first case to be respectively fitted with the first to m-th fitted portions.

7. The semiconductor pressure sensor device according to claim 6, wherein:

the first to m-th fitted portions are provided on a sidewall portion of the peripheral wall portion of the first case from which the plurality of lead terminals extend; and the first to m-th fitting portions are provided at the terminal housing to be respectively fitted with the first to m-th fitted portions.

8. The semiconductor pressure sensor device according to claim 6, wherein:

the first to m-th fitted portions include first to fourth fitted portions;

the first to m-th fitting portions include a first fitting portion to a fourth fitting portion;

the first and second fitting portions respectively include first and second projecting portions that project along a direction in which the first case and the terminal housing are brought closer to each other, and the third and fourth fitting portions respectively include first and second wall portions that form a part of the third opposing sidewall portion; and the first and second fitted portions respectively include recesses shaped to be opened in a direction toward the terminal housing and a direction away from each other and to be fitted with the first and second fitting portions, and the third and fourth fitted portions respectively include third and fourth projecting portions that project toward the terminal housing.

9. The semiconductor pressure sensor device according to claim 1, wherein
the opening portion of the first case is blocked by a sheet that is air permeable but not water permeable.

10. The semiconductor pressure sensor device according to claim 7, wherein:
the first to m-th fitted portions include first to fourth fitted portions;
the first to m-th fitting portions include a first fitting portion to a fourth fitting portion;
the first and second fitting portions respectively include first and second projecting portions that project along a direction in which the first case and the terminal housing are brought closer to each other, and the third and fourth fitting portions respectively include first and second wall portions that form a part of the third opposing sidewall portion; and
the first and second fitted portions respectively include recesses shaped to be opened in a direction toward the terminal housing and a direction away from each other and to be fitted with the first and second fitting portions, and the third and fourth fitted portions respectively include third and fourth projecting portions that project toward the terminal housing.

11. The semiconductor pressure sensor device according to claim 2, wherein
the opening portion of the first case is blocked by a sheet that is air permeable but not water permeable.

12. The semiconductor pressure sensor device according to claim 3, wherein
the opening portion of the first case is blocked by a sheet that is air permeable but not water permeable.

13. The semiconductor pressure sensor device according to claim 4, wherein
the opening portion of the first case is blocked by a sheet that is air permeable but not water permeable.

14. The semiconductor pressure sensor device according to claim 5, wherein
the opening portion of the first case is blocked by a sheet that is air permeable but not water permeable.

15. The semiconductor pressure sensor device according to claim 6, wherein
the opening portion of the first case is blocked by a sheet that is air permeable but not water permeable.

16. The semiconductor pressure sensor device according to claim 7, wherein
the opening portion of the first case is blocked by a sheet that is air permeable but not water permeable.

17. The semiconductor pressure sensor device according to claim 8, wherein
the opening portion of the first case is blocked by a sheet that is air permeable but not water permeable.

18. The semiconductor pressure sensor device according to claim 10, wherein
the opening portion of the first case is blocked by a sheet that is air permeable but not water permeable.

* * * * *